(12) United States Patent
Liu (10) Patent No.: US 7,986,157 B1
(45) Date of Patent: Jul. 26, 2011

(54) HIGH SPEED PROBING APPARATUS FOR SEMICONDUCTOR DEVICES AND PROBE STAGE FOR THE SAME

(75) Inventor: Yong Yu Liu, Hsinchu (TW)

(73) Assignee: Star Technologies Inc., Hsinchu (TW)

( * ) Notice: Subject to any disclaimer, the term of this patent is extended or adjusted under 35 U.S.C. 154(b) by 0 days.

(21) Appl. No.: 12/874,563

(22) Filed: Sep. 2, 2010

(51) Int. Cl.
*G01R 31/20* (2006.01)
(52) U.S. Cl. .............. 324/754.03; 324/762.01
(58) Field of Classification Search .......... None
See application file for complete search history.

(56) References Cited

U.S. PATENT DOCUMENTS

| 5,315,237 | A  * | 5/1994 | Iwakura et al. | 324/754.11 |
| 5,533,398 | A  * | 7/1996 | Sakurai | 73/573 |
| 5,543,723 | A  * | 8/1996 | Shinagawa et al. | 324/754.23 |
| 6,552,556 | B1 * | 4/2003 | Miki | 324/750.22 |
| 7,170,304 | B2 * | 1/2007 | Schaeffer et al. | 324/750.03 |
| 7,498,824 | B2 * | 3/2009 | Lane | 324/715 |
| 2003/0178988 | A1 * | 9/2003 | Kim | 324/158.1 |
| 2007/0018653 | A1 * | 1/2007 | Choi | 324/500 |
| 2008/0100312 | A1 * | 5/2008 | Breinlinger | 324/754 |

* cited by examiner

*Primary Examiner* — Ha Tran T Nguyen
*Assistant Examiner* — Arleen M Vazquez
(74) *Attorney, Agent, or Firm* — WPAT, P.C.; Anthony King (57) ABSTRACT

A probing apparatus for semiconductor devices includes a housing configured to define a testing chamber, a device holder positioned in the housing and configured to receive at least one device under test, and at least one probe stage positioned in the housing. In one embodiment of the present disclosure, the probe stage includes a base, a retaining arm pivotally coupled with the base and having a retaining portion configured to retain at least one probe, and a stepper positioned on the base. In one embodiment of the present disclosure, the stepper is configured in response to an electric signal to move the probe downward through the retaining arm to contact a device under test and to move the probe upward through the retaining arm to separate from the device under test such that the up-and-down movement of the probe can be performed at relatively high frequency of typically greater than six cycles per second. In one embodiment of the present disclosure, the stepper further equipped with a contact sensor configured to sense the contact of the probe to the device under test.

34 Claims, 11 Drawing Sheets

HIGH SPEED PROBING APPARATUS FOR SEMICONDUCTOR DEVICES AND PROBE STAGE FOR THE SAME

BACKGROUND OF THE INVENTION (A) Field of the Invention

The present disclosure relates to a high speed probing apparatus for semiconductor devices and a probe stage for the same, and more particularly, to a probing apparatus for semiconductor devices and a probe stage for the same equipped with a high speed stepper configured to move the probe downward to contact a device under test and to move the probe upward to separate from the device under test and further equipped with a contact sensor configured to sense the contact of the probe to the device under test.

(B) Description of the Related Art

Generally, it is necessary to test the electrical characteristics of semiconductor devices such as integrated circuit devices and light-emitting devices at the wafer level to check whether the semiconductor device satisfies the product specification. Semiconductor devices with electrical and optical characteristics satisfying the specification are selected for the subsequent packaging process, and the other devices are discarded to avoid additional packaging cost. Test time and cost primarily depend on the moving speed of the stage on which the wafer is disposed, with higher moving speeds corresponding to lower test time and cost.

Figure 1:
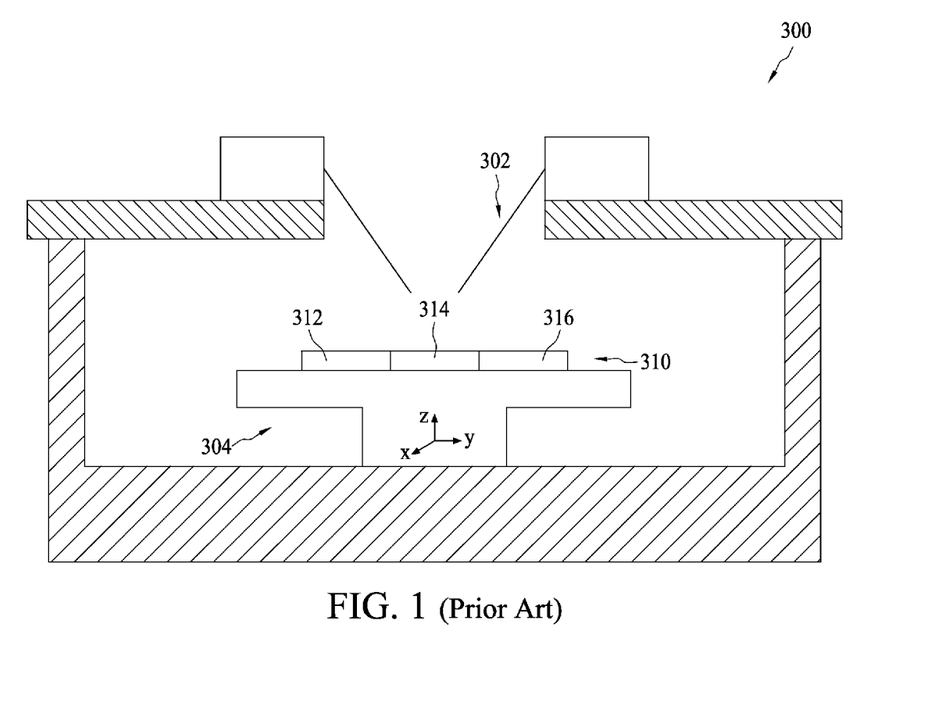
FIG. 1 and FIG. 2 illustrate a traditional probe system.
Figure 2:
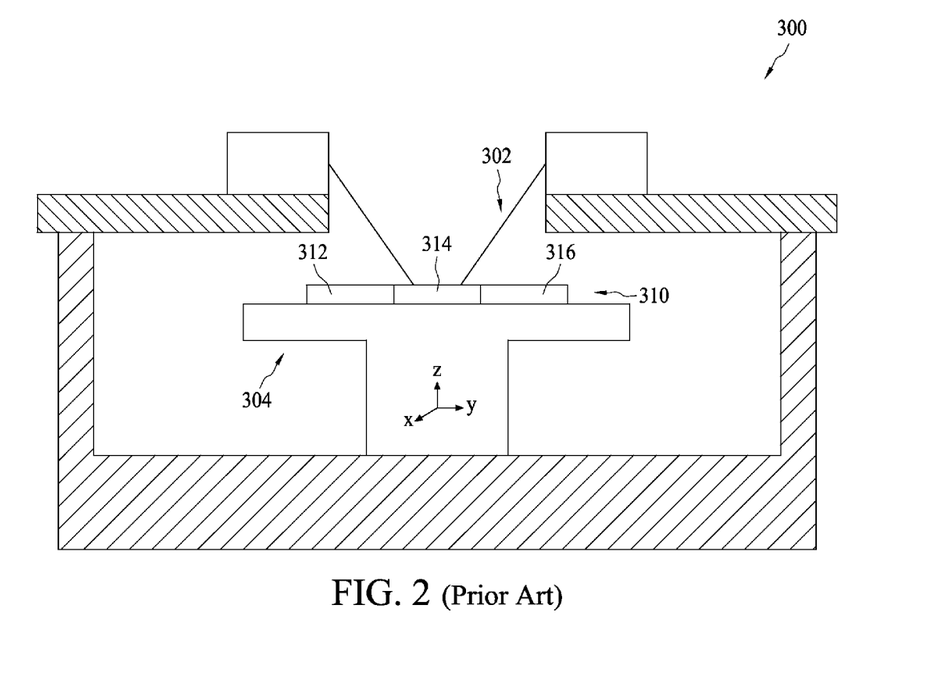
Figure 3:
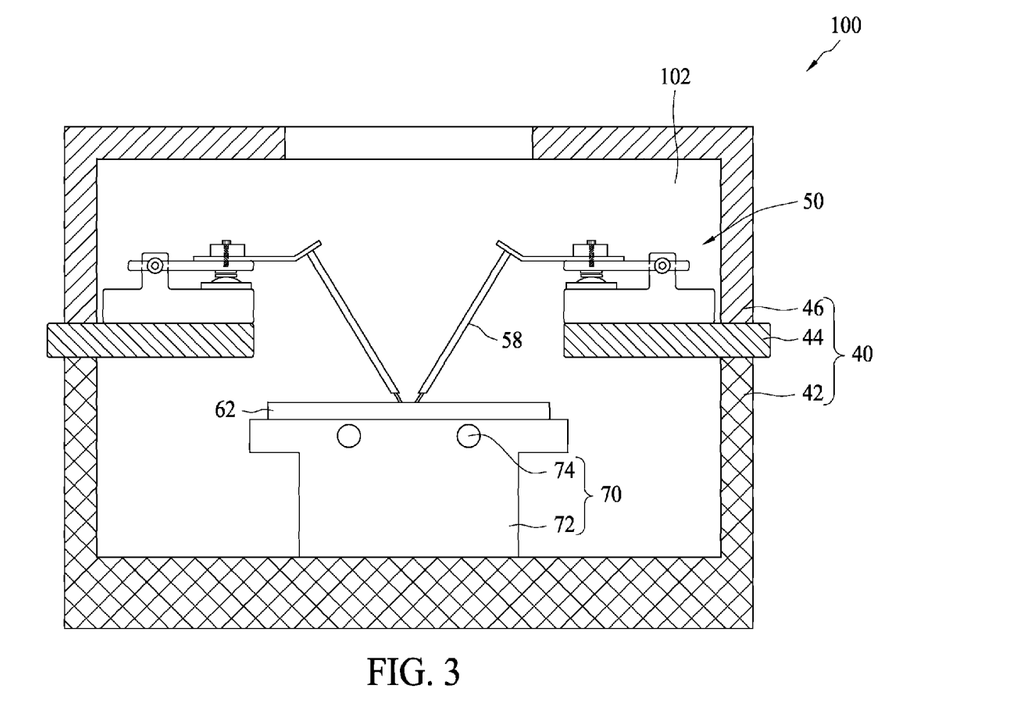
FIGS. 3 to 6 illustrate a probing apparatus according to one embodiment of the present disclosure.

FIG. 1 and FIG. 2 illustrate a traditional probe system 300 using probe cards or probe units 302 for contacting the devices under test 312, 314, and 316 of the wafer 310. The device holder 304 such as the chuck holding the devices under test can move in three axes: X, Y and Z. To initiate the electrical testing, the device holder 304 moves laterally such that one device 314 aligns with the probe units 302 before moving the wafer 310 upward such that the probe units 302 contact the device 314 to form an electrical connection, and the electrical testing proceeds; once the electrical testing is completed, the device holder 304 moves the wafer 310 downward such that the probe units 302 separate from the respective devices; the device holder 304 then moves laterally such that another device 316 aligns with the probe units 302, and the device holder 304 moves the wafer 310 upward to repeat the electrical testing.

This design is widely used in current testing; for example, US 2008/0100312 discloses a test system that uses this design to move the devices under test in the X, Y, and Z directions as shown in FIG. 1 and FIG. 2. However, this design cannot be applied to the high speed testing system because the device holder 304 is relatively heavy and the up-and-down movement frequency is typically limited to below six (6) cycles per second.

SUMMARY OF THE INVENTION

One aspect of the present disclosure provides a high speed probing apparatus for semiconductor devices and a probe stage equipped with a high speed stepper configured to move the probe downward to contact a device under test and to move the probe upward to separate from the device under test and further equipped with a contact sensor configured to sense the contact of the probe to the device under test.

One aspect of the present disclosure discloses a probe stage comprising a base, a retaining arm pivotally coupled with the base and having a retaining portion configured to retain at least one probe, and a stepper positioned on the base. In one embodiment of the present disclosure, the stepper is configured in response to an electric signal to move the probe downward through the retaining arm to contact a device under test and to move the probe upward through the retaining arm to separate from the device under test such that the up-and-down movement of the probe can be performed at relatively higher frequency of typically greater than six cycles per second. In one embodiment of the present disclosure, the probe stage further comprises a contact sensor configured to sense the contact of the probe to the device under test.

Another aspect of the present disclosure provides a probing apparatus for semiconductor devices comprising a housing configured to define a testing chamber, a device holder positioned in the housing and configured to receive at least one device under test, and at least one probe stage positioned in the housing. In one embodiment of the present disclosure, the probe stage includes a base, a retaining arm pivotally coupled with the base and having a retaining portion configured to retain at least one probe, and a stepper positioned on the base. In one embodiment of the present disclosure, the stepper is configured in response to an electric signal to move the probe downward through the retaining arm to contact a device under test and to move the probe upward through the retaining arm to separate from the device under test such that the up-and-down movement of the probe can be performed at relatively higher frequency of typically greater than six cycles per second. In one embodiment of the present disclosure, the probe stage further comprises a contact sensor configured to sense the contact of the probe to the device under test.

According to the prior art, the design of the device holder cannot be applied to the high speed testing system because the device holder is very heavy and the up-and-down movement frequency is typically limited to below six (6) cycles per second. In contrast, the present disclosure uses the high speed stepper to move the light probe up and down to implement the contact of the device under test and the probe, instead of moving the heavy device holder up and down to implement the contact of the device under test and the probe. Consequently, the up-and-down movement of the probe can be performed at relatively higher frequency of typically greater than six cycles per second.

The foregoing has outlined rather broadly the features and technical advantages of the present disclosure in order that the detailed description of the invention that follows may be better understood. Additional features and advantages of the invention will be described hereinafter, and form the subject of the claims of the invention. It should be appreciated by those skilled in the art that the conception and specific embodiment disclosed might be readily utilized as a basis for modifying or designing other structures or processes for carrying out the same purposes of the present disclosure. It should also be realized by those skilled in the art that such equivalent constructions do not depart from the spirit and scope of the invention as set forth in the appended claims.

BRIEF DESCRIPTION OF THE DRAWINGS

The objectives and advantages of the present disclosure will become apparent upon reading the following description and upon reference to the accompanying drawings in which.

DETAILED DESCRIPTION OF THE INVENTION

FIGS. 3 to 6 illustrate a probing apparatus 100 according to one embodiment of the present disclosure. The probing apparatus 100 comprises a housing 40, at least one probe stage 50 positioned in the housing 40 and configured to retain at least one probe 58, and a device holder 70 positioned in the housing and configured to receive at least one semiconductor device 62 under test. In one embodiment of the present disclosure, the housing 40 includes a body 42, a platen 44 positioned on the body 42 and a cover 46 configured to form a testing chamber 102 with the probe stage 50 and the device holder 70 positioned inside the testing chamber 102, wherein the probe stage 50 is positioned on the platen 44. In one embodiment of the present disclosure, the device holder 70 includes a movable stand 72 positioned in the housing 40, and a temperature-controller 74 such as a heater and/or cooler positioned in the device holder 70 and configured to control the temperature of the device holder 70.

Figure 4:
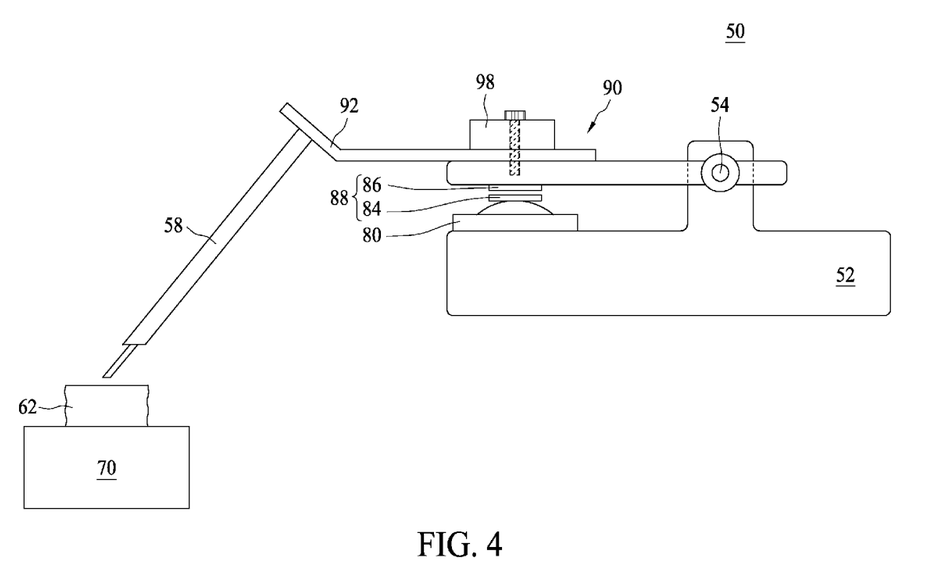

Referring to FIG. 4, in one embodiment of the present disclosure, the probe stage 50 includes a base 52 having a pivot 54, a retaining arm 90 pivotally coupled with the base 52 through the pivot 54 and having a retaining portion 92 configured to retain at least one probe 58, and a stepper 80 positioned on the base 52. In one embodiment of the present disclosure, the stepper 80 is configured in response to an electric signal to move the probe 58 downward through the retaining arm 90 to contact the device 62 under test and to move the probe 58 upward through the retaining arm 90 to separate from the device 62 under test such that the up-and-down movement of the probe 58 can be performed at higher frequency of typically greater than six cycles per second.

In one embodiment of the present disclosure, the stepper 80 is implemented by a piezoelectric stepper, which moves upward and downward in response to an applied voltage signal. In one embodiment of the present disclosure, the stepper 80 is implemented by an electromagnet stepper such as a voice coil stepper, which could be a commonly used small size audio speaker and moves upward and downward in response to an applied current signal.

Figure 5:
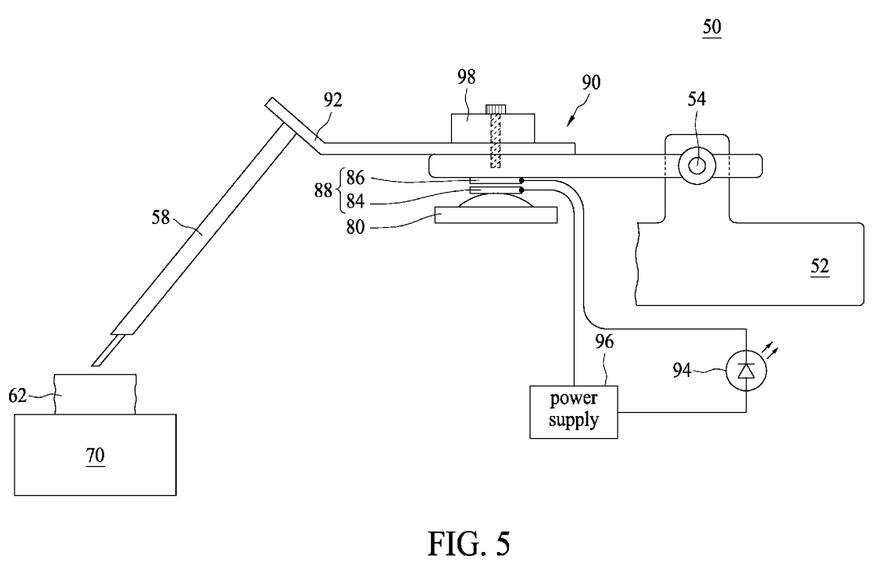

Referring to FIG. 5, in one embodiment of the present disclosure, the probe stage 50 comprises a contact sensor 88 configured to sense the contact of the probe 58 to the device 62 under test. In one embodiment of the present disclosure, the contact sensor 88 includes a first terminal 84 positioned on the stepper 80 and a second terminal 86 positioned on the retaining arm 90, and the first terminal 84 faces the second terminal 86. In one embodiment of the present disclosure, as the stepper 80 is supplied with a current in such as way that it causes the first terminal 84 to move upwards and in contact with the second terminal 86, and in turn causing the retaining arm 90 to move upward by the stepper 80 such that the probe 58 separates from the device 62; and as the stepper 80 is supplied with a current in such as way that it causes the first terminal 84 to move downwards, causing the probe 58 in contact with the device 62, and the first terminal 84 separates from the second terminal 86. In other words, the first terminal 84 is configured to contact the second terminal 86 when the probe 58 separates from the device 62 under test, and the first terminal 84 is configured to separate from the second terminal 86 when the probe 58 contacts the device 62 under test.

In one embodiment of the present disclosure, the probe stage 50 includes a light-emitting device 94 electrically connected to the contact sensor 88, and a power supply 96 electrically connected to the contact sensor 88 and the light-emitting device 94 in series. As the stepper 80 moves the first terminal 84 to contact the second terminal 86 so as to separate the probe 58 from the device 62, the contact of the first terminal 84 with the second terminal 86 forms a current loop such that the light-emitting device 94 emits light; and as the stepper 80 moves the first terminal 84 downward, the probe 58 contacts the device 62, the first terminal 84 separates from the second terminal 86, and the current loop opens such that the light-emitting device 94 stops emitting light. In other words, the light-emitting device 94 functions as a contact indicator of the probe 58.

Figure 6:
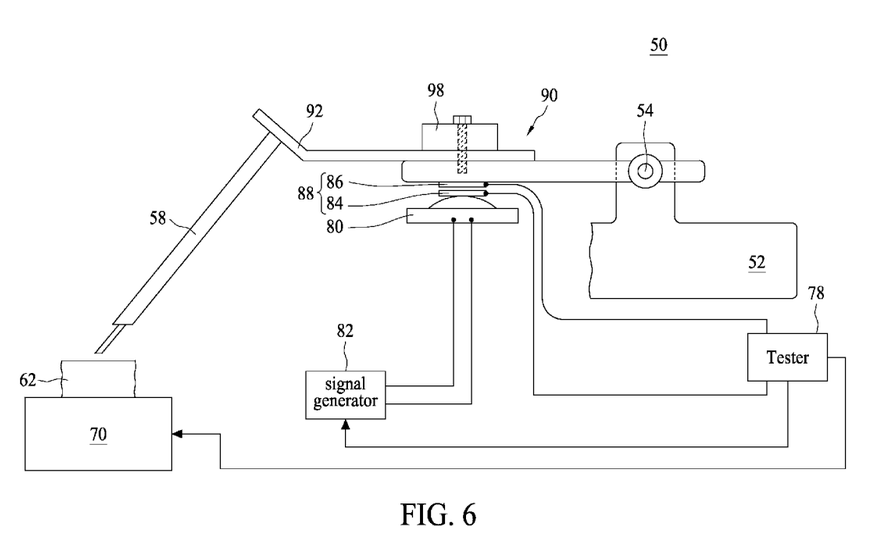
Figure 7:
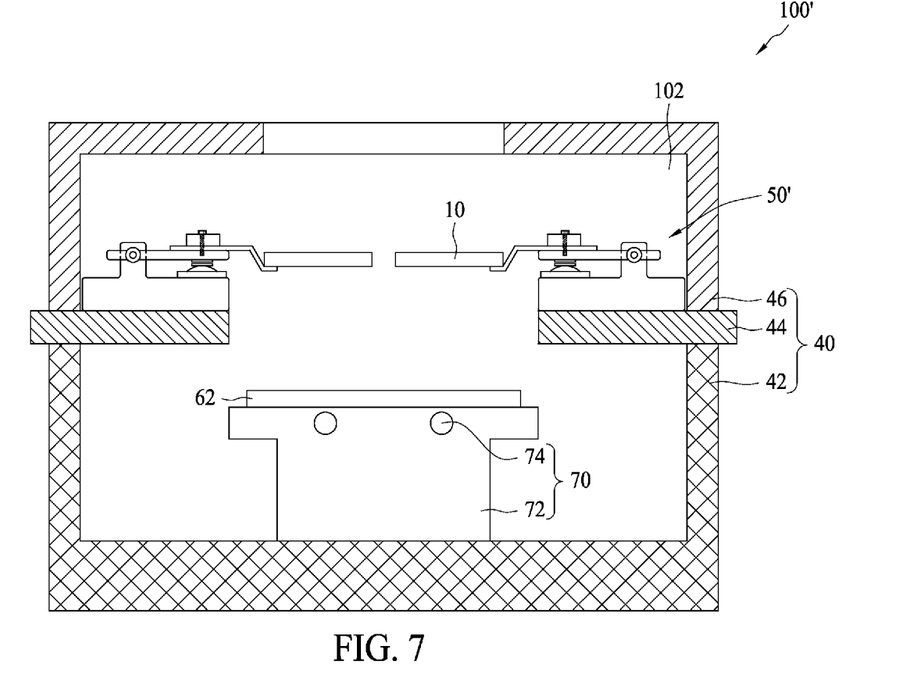
FIGS. 7 to 11 illustrate a probing apparatus according to another embodiment of the present disclosure.

Referring to FIG. 6, in one embodiment of the present disclosure, the contact sensor 88 is electrically connected to a tester 78, such that the separation of the first terminal 84 from the second terminal 86 informs the tester 78 of the electrical contact of the probe 58 with the device 62, and the tester 78 sends test signals (wire connection not shown in the drawings) to the device 62 and receives response signals from the device 62 through the probe 58. In one embodiment of the present disclosure, the tester 78 is electrically connected to a signal generator 82 configured to generate the electrical signal; when the testing of the device 62 is completed, the tester 78 instructs the signal generator 82 to send a moving-up signal to the stepper 88 so that the first terminal 84 contacts and moves the second terminal 86 further upward and the probe 58 separates from the device 62. In one embodiment of the present disclosure, the tester 78 is electrically connected to the device holder 70, the contact of the first terminal 84 with the second terminal 86 informs the tester 78 of the separation of the probe 58 from the device 62, and the tester 78 can then instruct the device holder 70 to move laterally such that another device under test aligns with the probe 58 to undergo the testing.

In one embodiment of the present disclosure, the probe stage 50 includes a load 98 positioned on the retaining arm 90 and configured to substantially apply a constant force to the device 62 under test through the probe 58. As the stepper 80 moves the first terminal 84 downward, the probe 58 contacts the device 62 and the first terminal 84 separates from the second terminal 86, and the load 98 becomes the only factor influencing the applied force of the probe 58 on the device 62 under test, i.e., the probe 58 applies a constant force to the device 62 under test as the weight of the load 98 is constant. In one embodiment of the present disclosure, the retaining arm 90 can be equipped with a variety of loads 98 having different weights to apply different constant forces to the device 62 under test through the probe 58.

Figure 8:
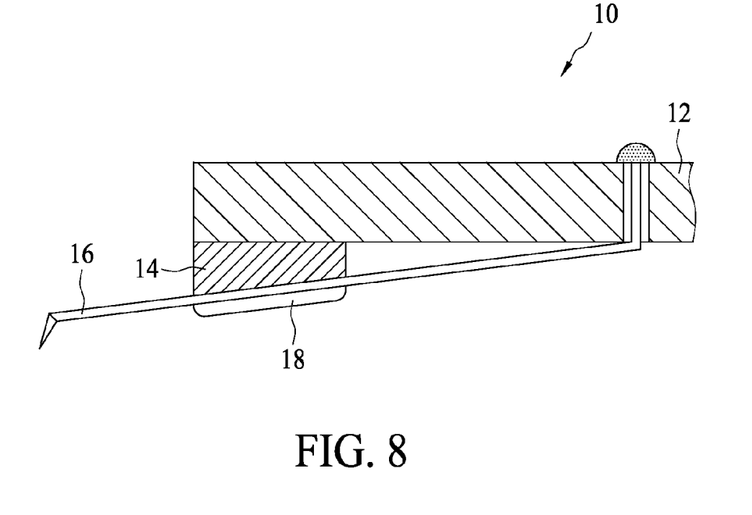

FIGS. 7 to 11 illustrate a probing apparatus 100' according to one embodiment of the present disclosure. The probing apparatus 100' comprises a housing 40, at least one probe stage 50' positioned on the housing 40 and configured to retain at least one probe card 10, and a device holder 70 positioned in the housing 40 and configured to receive at least one semiconductor device 62 under test. In one embodiment of the present disclosure, the housing 40 includes a body 42, a platen 44 positioned on the body 42 and a cover 46 configured to form a testing chamber 102 with the probe stage 50' and the device holder 70 positioned inside the testing chamber 102, wherein the probe stage 50' is positioned on the platen 44. In one embodiment of the present disclosure, the device holder 70 includes a movable stand 72 positioned in the housing 40, and a temperature-controller 74 such as a heater and/or cooler positioned in the device holder 70 and configured to control the temperature of the device holder 70. In one embodiment of the present disclosure, the probe card 10 includes a substrate 12, a supporter 14 positioned on the substrate 12, and a plurality of probes 16 fixed on the supporter 14 by epoxy resin 18, as shown in FIG. 8.

Figure 9:
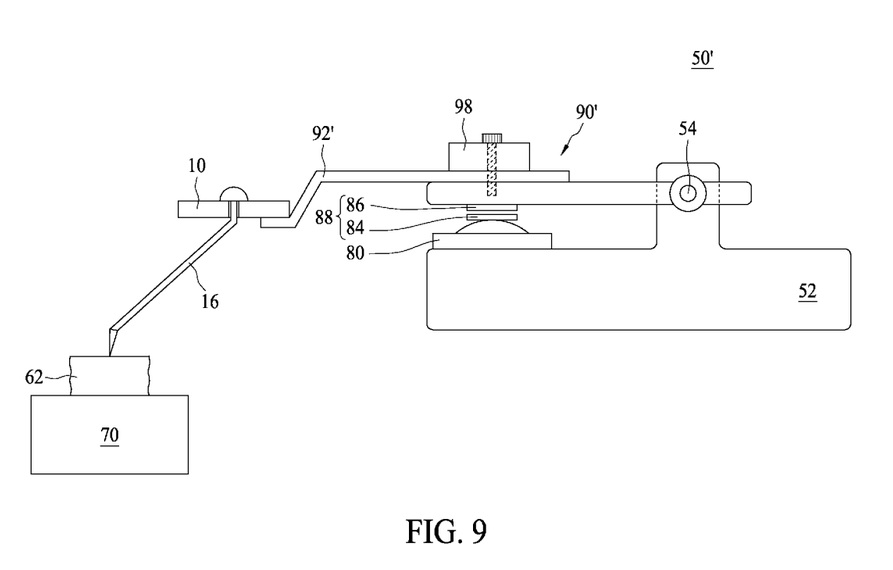

Referring to FIG. 9, in one embodiment of the present disclosure, the probe stage 50' includes a base 52 having a pivot 54, a retaining arm 90' pivotally coupled with the base 52 through the pivot 54 and having a retaining portion 92' configured to retain at least one probe card 10 with a probe 16, and a stepper 80 positioned on the base 52. In one embodiment of the present disclosure, the stepper 80 is configured in response to an electric signal to move the probe 16 downward through the retaining arm 90' to contact the device 62 under test and to move the probe 16 upward through the retaining arm 90' to separate from the device 62 under test such that the up-and-down movement of the probe 16 can be performed at a higher frequency of typically greater than six cycles per second.

In one embodiment of the present disclosure, the stepper 80 is implemented by a piezoelectric stepper, which moves upward and downward in response to an applied voltage signal. In one embodiment of the present disclosure, the stepper 80 is implemented by an electromagnet stepper such as a voice coil stepper, which could be a commonly used small size audio speaker and moves upward and downward in response to an applied current signal.

Figure 10:
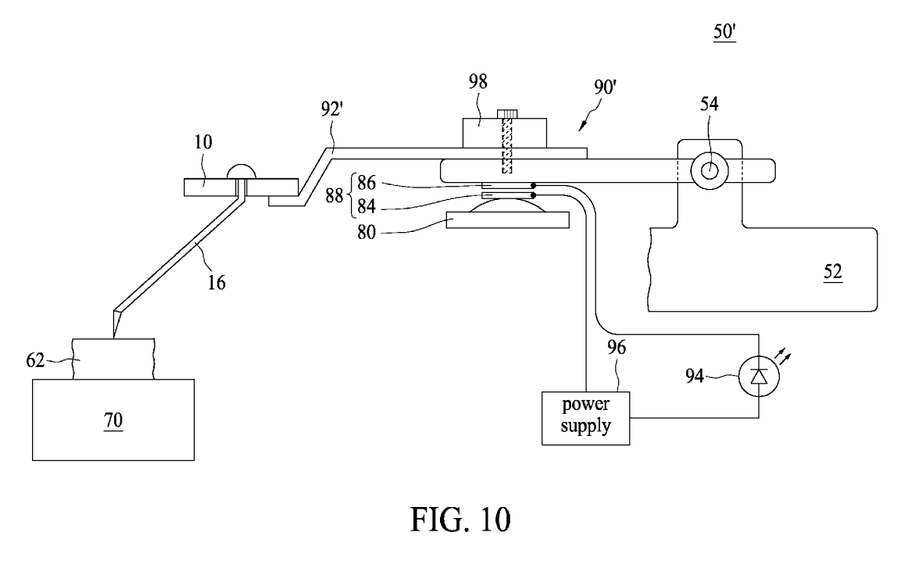

Referring to FIG. 10, in one embodiment of the present disclosure, the probe stage 50' comprises a contact sensor 88 configured to sense the contact of the probe 16 to the device 62 under test. In one embodiment of the present disclosure, the contact sensor 88 includes a first terminal 84 positioned on the stepper 80 and a second terminal 86 positioned on the retaining arm 90', and the first terminal 84 faces the second terminal 86. In one embodiment of the present disclosure, as the stepper 80 is supplied with a current in such as way that it causes the first terminal 84 to move upwards and in contact the second terminal 86, and in turn causing the retaining arm 90' to move upward by the stepper 80 such that the probe 16 separates from the device 62; and as the stepper 80 is supplied with a current in such as way that it causes the first terminal 84 to move downwards, causing the probe 16 in contact with the device 62, and the first terminal 84 separates from the second terminal 86. In other words, the first terminal 84 is configured to contact the second terminal 86 when the probe 16 separates from the device 62 under test, and the first terminal 84 is configured to separate from the second terminal 86 when the probe 16 contacts the device 62 under test.

In one embodiment of the present disclosure, the probe stage 50' includes a light-emitting device 94 electrically connected to the contact sensor 88, and a power supply 96 electrically connected to the contact sensor 88 and the light-emitting device 94 in series. As the stepper 80' moves the first terminal 84 upward to contact the second terminal 86 so as to separate the probe 16 from the device 62, the contact of the first terminal 84 with the second terminal 86 forms a current loop such that the light-emitting device 94 emits light; and as the stepper 80 moves the first terminal 84 downward, the probe 16 contacts the device 62, the first terminal 84 separates from the second terminal 86, the current loop opens such that the light-emitting device 94 stops emitting light. In other words, the light-emitting device 94 functions as a contact indicator of the probe 16.

Figure 11:
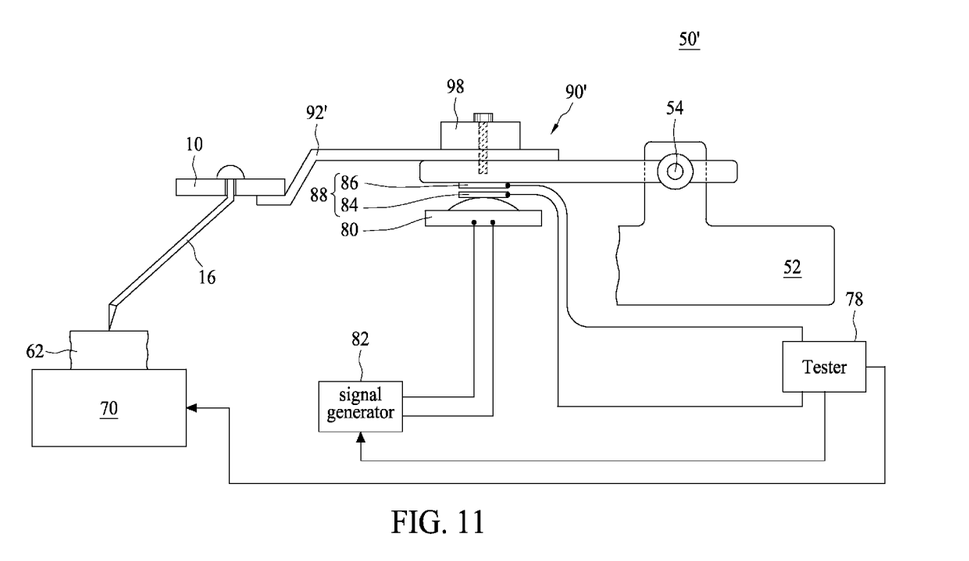

Referring to FIG. 11, in one embodiment of the present disclosure, the contact sensor 88 is electrically connected to a tester 78, such that the separation of the first terminal 84 from the second terminal 86 informs the tester 78 of the electrical contact of the probe 16 with the device 62, and the tester 78 sends test signals (wire connection not shown in the drawings) to the device 62 and receives response signals from the device 62 through the probe 16. In one embodiment of the present disclosure, the tester 78 is electrically connected to a signal generator 82 configured to generate the electrical signal, when the testing of the device 62 is completed the tester 78 instructs the signal generator 82 to send a moving-up signal to the stepper 88 so that the first terminal 84 contacts and moves the second terminal 86 further upward and the probe 16 separates from the device 62. In one embodiment of the present disclosure, the tester 78 is electrically connected to the device holder 70, the contact of the first terminal 84 with the second terminal 86 informs the tester 78 of the separation of the probe 16 from the device 62, and the tester 78 can then instruct the device holder 70 to move laterally such that another device under test aligns with the probe 16 to undergo the testing.

In one embodiment of the present disclosure, the probe stage 50' includes a load 98 positioned on the retaining arm 90' and configured to substantially apply a constant force to the device 62 under test through the probe 16. As the stepper 80 moves the first terminal 84 downward, the probe 16 contacts the device 62 and the first terminal 84 separates from the second terminal 86, and the load 98 becomes the only factor influencing the applied force of the probe 16 on the device 62 under test, i.e., the probe 16 applies a constant force to the device 62 under test as the weight of the load 98 is constant. In one embodiment of the present disclosure, the retaining arm 90' can be equipped with a variety of loads 98 having different weights to apply different constant forces to the device 62 under test through the probe 16.

According to the prior art, the design of the device holder cannot be applied to the high speed testing system because the device holder is relatively heavy and the up-and-down movement frequency is typically limited to below six (6) cycles per second. In contrast, the present disclosure uses the high speed stepper to move the probe of relatively light weight up and down to implement the contact of the device under test and the probe, instead of moving the relatively heavier device holder up and down to implement the contact of the device under test and the probe. Consequently, the up-and-down movement of the probe can be performed at relatively higher frequency of typically greater than six cycles per second and up to several thousand cycles per second to meet the high speed testing requirement.

Although the present disclosure and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the description of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A probe stage, comprising:
   a base;
   a retaining arm pivotally coupled with the base and having a retaining portion configured to retain at least one probe;
   a stepper positioned on the base, wherein the stepper is configured in response to an electric signal to move the probe downward through the retaining arm to contact a device under test or to move the probe upward through the retaining arm to separate from the device under test; and a contact sensor;

wherein the contact sensor includes a first terminal and a second terminal;

wherein the first terminal is configured to contact the second terminal when the probe separates from the device under test.

2. The probe stage of claim 1, wherein said contact sensor being configured to sense the contact of the probe to the device under test.

3. The probe stage of claim 1, wherein the first terminal is positioned on the stepper, the second terminal is positioned on the retaining arm, and the first terminal faces the second terminal.

4. The probe stage of claim 1, wherein the first terminal is configured to separate from the second terminal when the probe contacts the device under test.

5. The probe stage of claim 1, further comprising a light-emitting device electrically connected to the contact sensor.

6. The probe stage of claim 1, further comprising a load positioned on the retaining arm and configured to substantially apply a constant force to the device under test through the probe.

7. The probe stage of claim 1, wherein the stepper is a voice coil stepper or a piezoelectric stepper.

8. The probe stage of claim 1, wherein the stepper is configured to move the probe up and down at a frequency greater than six cycles per second.

9. The probe stage of claim 1, wherein the retaining portion is configured to retain a probe card with the probe.

10. A probing apparatus, comprising:
a housing configured to define a testing chamber;
a device holder positioned in the housing and configured to receive at least one device under test;
a contact sensor; and
at least one probe stage positioned in the housing, the probe stage including:
 a base positioned on the housing;
 a retaining arm pivotally coupled with the base and having a retaining portion configured to retain at least one probe; and
 a stepper positioned on the base, wherein the stepper is configured in response to an electric signal to move the probe downward through the retaining arm to contact a device under test or to move the probe upward through the retaining arm to separate from the device under test;
wherein the contact sensor includes a first terminal and a second terminal;
wherein the first terminal is configured to contact the second terminal when the probe separates from the device under test.

11. The probing apparatus of claim 10, wherein the contact sensor is configured to sense the contact of the probe to the device under test.

12. The probing apparatus of claim 10, wherein the first terminal is positioned on the stepper, the second terminal is positioned on the retaining arm, and the first terminal faces the second terminal.

13. The probing apparatus of claim 10, wherein the first terminal is configured to separate from the second terminal when the probe contacts the device under test.

14. The probing apparatus of claim 10, further comprising a light-emitting device electrically connected to the contact sensor.

15. The probing apparatus of claim 14, further comprising a power supply electrically connected to the light-emitting device and the contact sensor in series.

16. The probing apparatus of claim 10, further comprising a tester electrically connected to the contact sensor.

17. The probing apparatus of claim 16, wherein the tester is electrically connected to a signal generator configured to generate the electric signal.

18. The probing apparatus of claim 16, wherein the tester is electrically connected to the device holder.

19. The probing apparatus of claim 10, further comprising a load positioned on the retaining arm and configured to substantially apply a constant force to the device under test through the probe.

20. The probing apparatus of claim 10, wherein the stepper is a voice coil stepper or a piezoelectric stepper.

21. The probing apparatus of claim 10, wherein the stepper is configured to move the probe up and down at a frequency greater than six cycles per second.

22. The probing apparatus of claim 10, wherein the retaining portion is configured to retain a probe card with the probe.

23. A probe stage, comprising:
a base;
a retaining arm pivotally coupled with the base and having a retaining portion configured to retain at least one probe;
a stepper positioned on the base, wherein the stepper is configured in response to an electric signal to move the probe downward through the retaining arm to contact a device under test or to move the probe upward through the retaining arm to separate from the device under test; and
a contact sensor;
wherein the contact sensor includes a first terminal and a second terminal;
wherein the first terminal is configured to separate from the second terminal when the probe contacts the device under test.

24. The probe stage of claim 23, further comprising a light-emitting device electrically connected to the contact sensor.

25. The probe stage of claim 23, further comprising a load positioned on the retaining arm and configured to substantially apply a constant force to the device under test through the probe.

26. The probe stage of claim 23, wherein the stepper is a voice coil stepper or a piezoelectric stepper.

27. The probe stage of claim 23, wherein the stepper is configured to move the probe up and down at a frequency greater than six cycles per second.

28. The probe stage of claim 23, wherein the retaining portion is configured to retain a probe card with the probe.

29. A probing apparatus, comprising:
a housing configured to define a testing chamber;
a device holder positioned in the housing and configured to receive at least one device under test;
a contact sensor; and
at least one probe stage positioned in the housing, the probe stage including:
 a base positioned on the housing;
 a retaining arm pivotally coupled with the base and having a retaining portion configured to retain at least one probe; and
 a stepper positioned on the base, wherein the stepper is configured in response to an electric signal to move the probe downward through the retaining arm to contact a device under test or to move the probe upward through the retaining arm to separate from the device under test;

wherein the contact sensor includes a first terminal and a second terminal;

wherein the first terminal is configured to separate from the second terminal when the probe contacts the device under test.

30. The probing apparatus of claim 29, further comprising a light-emitting device electrically connected to the contact sensor.

31. The probing apparatus of claim 30, further comprising a power supply electrically connected to the light-emitting device and the contact sensor in series.

32. The probing apparatus of claim 29, further comprising a tester electrically connected to the contact sensor.

33. The probing apparatus of claim 32, wherein the tester is electrically connected to a signal generator configured to generate the electric signal.

34. The probing apparatus of claim 32, wherein the tester is electrically connected to the device holder.

* * * * *